United States Patent
Chen et al.

(10) Patent No.: US 9,196,723 B1
(45) Date of Patent: Nov. 24, 2015

(54) HIGH VOLTAGE SEMICONDUCTOR DEVICES WITH SCHOTTKY DIODES

(71) Applicant: UNITED MICROELECTRONICS CORP., Hsin-Chu (TW)

(72) Inventors: Kuan-Yu Chen, New Taipei (TW); Tseng-Hsun Liu, Taipei (TW); Min-Hsuan Tsai, Tainan (TW); Te-Chang Chiu, Hsinchu County (TW); Chiu-Ling Lee, Hsinchu (TW); Chiu-Te Lee, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/564,050

(22) Filed: Dec. 8, 2014

(51) Int. Cl.
*H01L 29/66* (2006.01)
*H01L 29/78* (2006.01)
*H01L 29/10* (2006.01)
*H01L 29/06* (2006.01)
*H01L 29/45* (2006.01)

(52) U.S. Cl.
CPC .......... *H01L 29/782* (2013.01); *H01L 29/0619* (2013.01); *H01L 29/1079* (2013.01); *H01L 29/45* (2013.01); *H01L 29/7816* (2013.01); *H01L 29/7817* (2013.01); *H01L 29/7823* (2013.01)

(58) Field of Classification Search
None
See application file for complete search history.

(56) References Cited

U.S. PATENT DOCUMENTS

| | | | |
|---|---|---|---|
| 8,154,073 B2 | 4/2012 | Aoki | |
| 2013/0168767 A1* | 7/2013 | Lin | H01L 27/0727 257/337 |
| 2013/0341705 A1* | 12/2013 | Raghavan | H01L 29/1095 257/328 |
| 2015/0187928 A1* | 7/2015 | Wang | H01L 29/782 257/337 |

* cited by examiner

*Primary Examiner* — Minh-Loan Tran
(74) *Attorney, Agent, or Firm* — Winston Hsu; Scott Margo

(57) ABSTRACT

The present invention provides a semiconductor device structure which integrates a lateral diffused metal oxide semiconductor (LDMOS) with a Schottky diode, including: a substrate, having a first conductivity type, a gate positioned on the substrate, a drain region formed in the substrate, the drain region having a second conductivity type complementary to the first conductivity type, a source region formed in the substrate, the source region having the second conductivity type, a high-voltage well region formed in the substrate, the high-voltage well region having a first conductivity type; a Schottky diode disposed on the substrate and disposed beside the LDMOS, wherein the semiconductor device structure is an asymmetric structure, and a deep well region disposed in the substrate and having the second conductivity type, wherein the LDMOS and the Schottky diode are all formed within the deep well region.

13 Claims, 2 Drawing Sheets

HIGH VOLTAGE SEMICONDUCTOR DEVICES WITH SCHOTTKY DIODES

BACKGROUND OF THE INVENTION

1. Field of the Invention

The invention relates to high voltage semiconductor devices, and in particular, to high voltage devices integrated with a Schottky diode device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor devices and lateral double-diffused MOS (LDMOS) transistor devices. Having advantages of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore the LDMOS transistor device can have higher breakdown voltage.

When a LDMOS device integrated with a Schottky diode device is formed in an integrated circuit, the ON-resistance (RON), $V_{SD}$ and the reverse recovery charge (Qrr) of the LDMOS can be decreased. However, the integrated circuit accumulates more area, and decreasing the effective area of the LDMOS.

SUMMARY OF THE INVENTION

The present invention provides a semiconductor device structure, comprising: a lateral diffused metal oxide semiconductor (LDMOS) comprising:
a substrate, having a first conductivity type, a gate positioned on the substrate, a drain region formed in the substrate, the drain region having a second conductivity type complementary to the first conductivity type, a source region formed in the substrate, the source region having the second conductivity type, a high-voltage well region formed in the substrate, the high-voltage well region having a first conductivity type;
a Schottky diode disposed on the substrate and disposed beside the LDMOS, wherein the semiconductor device structure is an asymmetric structure, and a deep well region disposed in the substrate and having the second conductivity type, wherein the LDMOS and the Schottky diode are all formed within the deep well region.

A main feature of the present invention is the semiconductor device structure is an asymmetric structure. Therefore, some components in different regions will not contact each other. In this way, the area of the semiconductor device structure which integrates a LDMOS device with a Schottky diode will be effectively decreased. For example, in conventional manufacturing process, the total pitch of a LDMOS device and a Schottky diode is about 48 nm, but in the present invention, the pitch of the semiconductor device structure which integrates a LDMOS device with a Schottky diode is only about 37 nm. Therefore, the pitch is reduced by about 37.5%.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
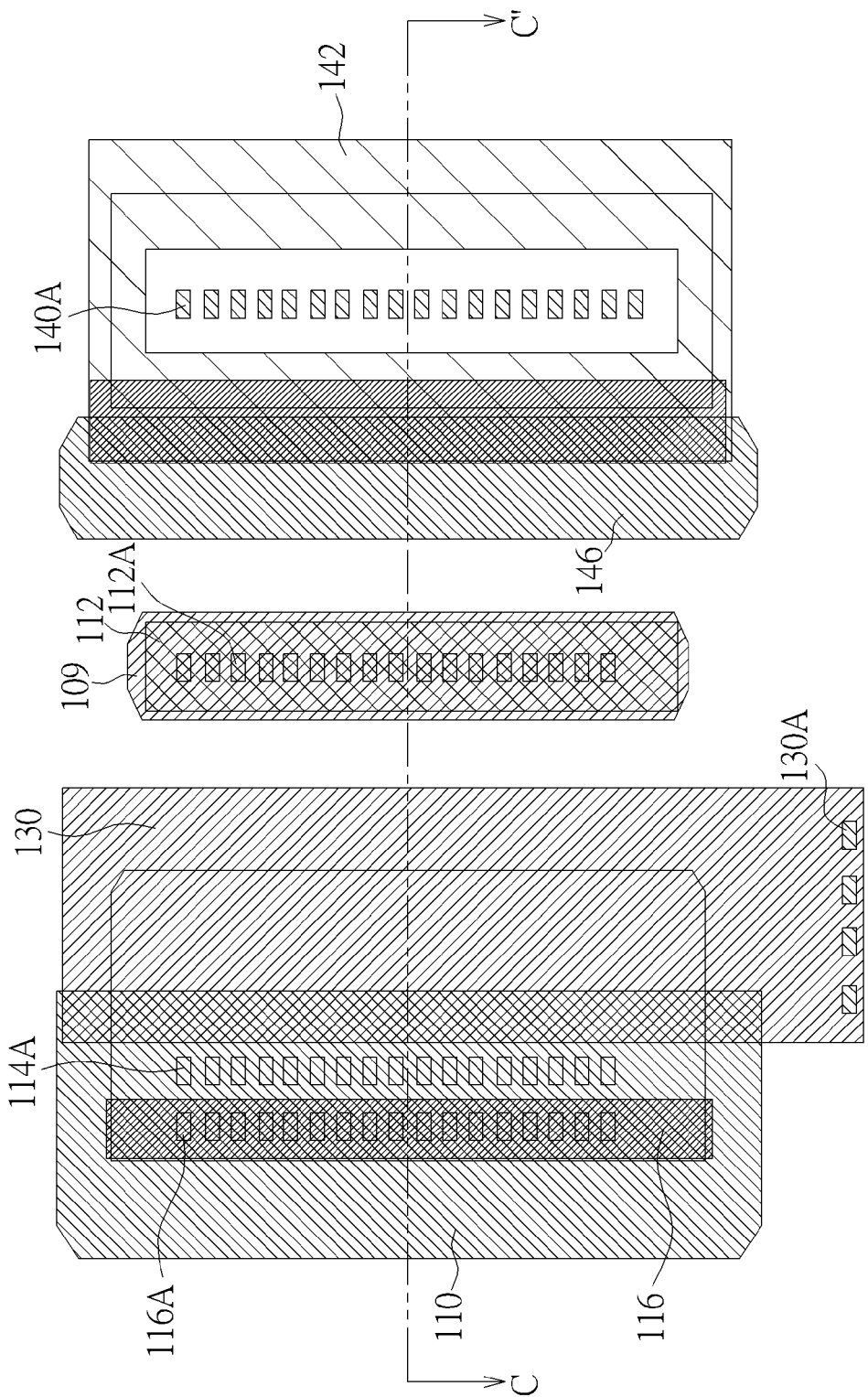
FIG. 1 is a top-view schematic drawing of a layout pattern of a semiconductor device structure which integrates a LDMOS device with a Schottky diode provided by a first preferred embodiment of the present invention.
Figure 2:
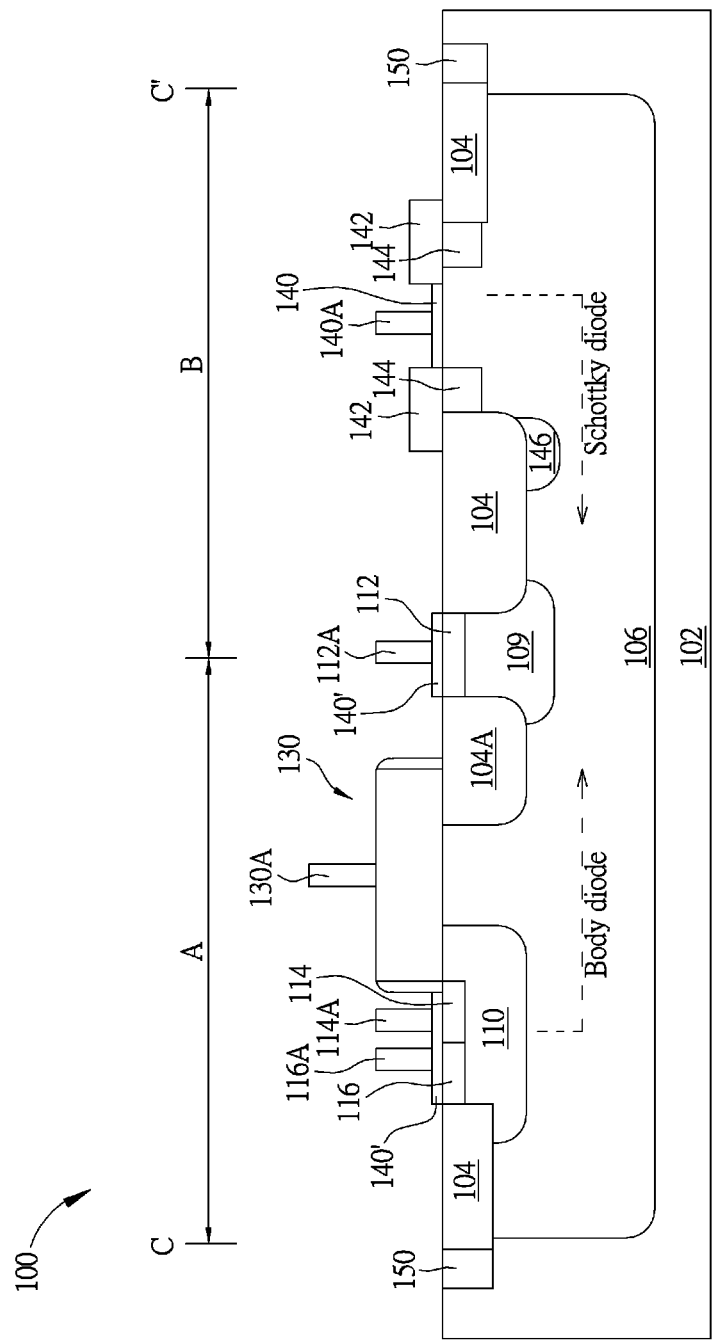
FIG. 2 is a cross-sectional view of the semiconductor device structure provided by the first preferred embodiment taken along line A-A' of FIG. 1.

Please refer to FIGS. 1 and 2, FIG. 1 is a top-view schematic drawing of a layout pattern of a semiconductor device structure which integrates a LDMOS device with a Schottky diode provided by a first preferred embodiment of the present invention, and FIG. 2 is a cross-sectional view of the semiconductor device structure provided by the first preferred embodiment taken along line C-C' of FIG. 1. As shown in FIGS. 1 and 2, a semiconductor device structure 100 which integrates a LDMOS device with a Schottky diode provided by the preferred embodiment is positioned in a substrate 102, such as a silicon substrate. The substrate 102 includes a first conductivity type. In the preferred embodiment, the first conductivity type is p type. The semiconductor device structure 100 further includes an insulating layer 104. It is noteworthy that for clarifying spatial relationships between certain specific doped regions of the semiconductor device structure 100, the insulating layer 104 is omitted from FIG. 1. However, those skilled in the art would easily realize the location where the insulating layer 104 is to be formed according to FIG. 2.

Please still refer to FIGS. 1 and 2. The semiconductor device structure 100 provided by the first preferred embodiment further includes a deep well 106 having a second conductivity type. The second conductivity type and the first conductivity type are complementary to each other. Accordingly, the second conductivity type is n type in the preferred embodiment. It is noteworthy that the semiconductor device structure 100 integrated a LDMOS device with a Schottky diode includes a LDMOS region A and a Schottky region B. In the following steps, the LDMOS will only be formed within the LDMOS region A, and the Schottky diode will only be formed in the Schottky region B, even though the LDMOS region A and the Schottky region B are not overlapped with each other, but some components, such as the drain region 112, are formed across the LDMOS region A and a Schottky region B. In other words, the drain region will be formed in partial LDMOS region A and in partial Schottky region B simultaneously.

Next, a drift region 109 and a high-voltage well region 110 (shown in FIG. 2) are formed in the deep well 106. The drift region 109 includes the second conductivity type while the high-voltage well region 110 includes the first conductivity type. Within the LDMOS region A, a drain region 112 is formed in the n-type drift region 109 while a source region 114 and a body region 116 are formed in the p-type high-voltage well region 110. The drain region 112 and the source region 114 include the second conductivity type and respectively serve as an n-type drain (n-drain) region 112 and an n-type source (n-source) region 114 for the LDMOS device. The body region 116 includes the first conductivity type and thus serves as a p-type body (p-body) region 116 for the LDMOS device. In addition, the p-body region 116 and the n-source region 114 are electrically connected as shown in FIGS. 1 and 2. Furthermore, a drain contact 112A, a source contact 114A, and a body contact 116A can be formed respectively in the n-drain region 112, the n-source region 114, and the p-body region 116 within the LDMOS region A.

The semiconductor device structure 100 also includes a gate 130 within the LDMOS region A. As shown in FIG. 2, the gate 130 is positioned on the substrate 102 and covers a portion of the insulating layer 104. Furthermore, a gate contact 130A can be formed in the on the fate 130 within the LDMOS region A.

Please still refer to FIGS. 1 and 2. Within the Schottky region B, a Schottky diode is formed on the substrate 102, in particular, disposed above the deep well region 106, the Schottky diode comprises: a Schottky electrode 140, and the Schottky electrode 140 preferably comprises a silicide layer. In addition, during the manufacturing process for forming the silicide layer (Schottky electrode 140), the silicide layer may further be formed on others region that include silicon and on the surface of the substrate. Therefore the silicide layer 140' will be formed on the substrate, and is especially formed on the drain region 112, the source region 114 and the body region 116. Furthermore, a Schottky contact 140A can be formed in the Schottky electrode 140. A insulating layer 142, such as silicide blocks (SAB) made of silicon nitride (SiN), is disposed on both sides of the Schottky electrode 140, wherein the salicide blocking layer 142 is a frame-shaped structure when viewed in top view, and partially overlaps the insulating layer 104 within the Schottky region B. Further, parts of the insulating layer 104 mentioned above are also disposed within the Schottky region B, and at least one insulating layer 104 which is disposed between the drain region 112 of the LDMOS and the Schottky electrode 140 of the Schottky diode. In addition, at least one first doped region 144 is disposed between the insulating layer 104 and the Schottky electrode 140. In particular, the first doped region 144 directly contacts the insulating layer 104 which is disposed between the drain region 112 of the LDMOS and the Schottky electrode 140 of the Schottky diode. The first doped region 144 includes the first conductivity type. Therefore the first doped region 144 is a p-doped region. And the first doped region 144 is disposed right below the salicide blocking layer 142. It is noteworthy that the first doped region 144 does not extend to the position which right under the Schottky electrode 140. In other words, within the Schottky region B, there are not any other doped regions disposed right below the silicide layer Schottky electrode 140 of the Schottky diode within the deep well region 106 expect for the deep well region 106 itself.

Furthermore, within the Schottky region B, at least one insulating layer 104 is disposed between the drain region 112 of the LDMOS and the Schottky electrode 140 of the Schottky diode. The semiconductor device structure 100 provided by the preferred embodiment further includes a second doped region 146 within Schottky region B. As shown in FIGS. 1 and 2, the second doped region 146 is positioned in between the n-drain region 112 and the first doped region 144, and in particular, is disposed under the insulating layer 104 which is disposed between the drain region 112 of the LDMOS and the Schottky electrode 140 of the Schottky diode. The drain region 112, the first region 144, and the second doped region 146 formed in the deep well region 106 are not only spaced apart from each other, but also electrically isolated from each other by the deep well region 106. The second doped region 146 includes the first conductivity type. Therefore the second doped region 146 is a p-doped region.

In this embodiment, the semiconductor device structure 100 further comprises a guard ring 150, wherein the guard ring 150 is a p-type doped region disposed in the p-type substrate 102 and surrounding the n-type deep well region 106 for avoiding the effect of the electric field in the deep well region 106 to the external devices.

A main feature of the present invention is the semiconductor device structure is an asymmetric structure. More precisely, in conventional LDMOS structure, usually, the LDMOS device is a symmetric structure, such as a ring-shaped structure or a racetrack-shaped structure when viewed in top-view. However, in the present invention, half of the LDMOS device is replaced by the Schottky diode. The LDMOS device and the Schottky diode are individually formed in different regions, and they share the same drain region. In the present invention, the LDMOS device and the Schottky diode have the same drain region 112. However, the LDMOS device and the Schottky diode are not overlapped with each other. In other words, the LDMOS is only disposed within half a region of the whole semiconductor device structure, and the Schottky diode is disposed within the rest of the half region of the semiconductor device structure. More precisely, both of the LDMOS region A and the Schottky region B are disposed within one deep well region 106, and furthermore, one guard ring 150 surrounds both of the LDMOS region A and the Schottky region B simultaneously. Therefore, some components indifferent regions will not contact each other. For example, the gate 130 disposed within the LDMOS region A will not contact the Schottky electrode 140 disposed within the Schottky region B directly. In this way, the area of the semiconductor device structure which integrates a LDMOS device with a Schottky diode will be effectively decreased. For example, in conventional manufacturing process, the total pitch of a LDMOS device and a Schottky diode is about 48 nm, but in the present invention, the pitch of the semiconductor device structure which integrates a LDMOS device with a Schottky diode is only about 37 nm. Therefore, the pitch is reduced by about 37.5%.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device structure which integrates a lateral diffused metal oxide semiconductor (LDMOS) with a Schottky diode, comprising:
    a lateral diffused metal oxide semiconductor (LDMOS), wherein the LDMOS comprises:
        a substrate, having a first conductivity type;
        a gate positioned on the substrate;
        a drain region formed in the substrate, the drain region having a second conductivity type complementary to the first conductivity type;
        a source region formed in the substrate, the source region having the second conductivity type; and
        a high-voltage well region formed in the substrate, the high-voltage well region having a first conductivity type;
    a Schottky diode disposed on the substrate and disposed beside the LDMOS, wherein the semiconductor device structure is an asymmetric structure; and
    a deep well region disposed in the substrate and having the second conductivity type, wherein the LDMOS and the Schottky diode are all formed within the deep well region.

2. The semiconductor device structure of claim 1, wherein gate structure is disposed on the substrate, covering parts of the deep well region and parts of the high-voltage well region.

3. The semiconductor device structure of claim 1, further comprising at least one guard ring disposed in the substrate and disposed out of the deep well region.

4. The semiconductor device structure of claim 3, wherein the LDMOS and the Schottky diode are surrounded by one guard ring.

5. The semiconductor device structure of claim 1, wherein the Schottky diode further comprises a silicide layer disposed on the substrate and disposed above the deep well region.

6. The semiconductor device structure of claim 5, wherein there is not any doped region disposed right below the silicide layer of the Schottky diode within the deep well region.

7. The semiconductor device structure of claim 1, further comprising a plurality of insulating layers disposed in the substrate, and at least one insulating layer is disposed between the drain region of the LDMOS and the silicide layer of the Schottky diode.

8. The semiconductor device structure of claim 7, further comprising a salicide blocking layer (SAB) disposed on the substrate and disposed beside of the silicide layer of the Schottky diode.

9. The semiconductor device structure of claim 8, wherein the SAB partially overlaps with the insulating layer which is disposed between the drain region of the LDMOS and the silicide layer of the Schottky diode.

10. The semiconductor device structure of claim 8, further comprising a first doped region disposed under the SAB and within the deep well region, the first doped region having the first conductivity type.

11. The semiconductor device structure of claim 10, wherein the first doped region directly contacts the insulating layer which is disposed between the drain region of the LDMOS and the silicide layer of the Schottky diode.

12. The semiconductor device structure of claim 7, further comprising a second doped region disposed under the insulating layer and within the deep well region, the second doped region having the first conductivity type.

13. The semiconductor device structure of claim 1, wherein the first conductivity type is p-type, and the second conductivity type is n-type.

\* \* \* \* \*